United States Patent
Chang et al.

(10) Patent No.: US 6,586,146 B2
(45) Date of Patent: Jul. 1, 2003

(54) METHOD OF FIGURING EXPOSURE ENERGY

(75) Inventors: Kun-Yuan Chang, Changhua Hsien (TW); Wang-Hsiang Ho, Hsin-Chu (TW); Yu-Ping Huang, Chia-yi County (TW); Li-Dar Tsai, Tainan City (TW); Chung-Yung Wu, Taipei Hsien (TW)

(73) Assignee: United Microelectronics, Hsincu (TW)

( * ) Notice: Subject to any disclaimer, the term of this patent is extended or adjusted under 35 U.S.C. 154(b) by 132 days.

(21) Appl. No.: 09/945,068

(22) Filed: Aug. 31, 2001

(65) Prior Publication Data

US 2003/0044700 A1 Mar. 6, 2003

(51) Int. Cl.$^7$ .................................................. G03F 9/00
(52) U.S. Cl. ....................................................... 430/30
(58) Field of Search ............................................ 430/30

(56) References Cited

U.S. PATENT DOCUMENTS 5,965,308 A * 10/1999 Ozawa ........................ 430/30
6,063,530 A * 5/2000 Grassmann .................. 430/30
6,124,064 A * 9/2000 Ozawa ........................ 430/30

\* cited by examiner

Primary Examiner—Christopher G. Young
(74) Attorney, Agent, or Firm—Charles C. H. Wu; Wu & Cheung, LLP

(57) ABSTRACT

A method of figuring an exposure energy. A required exposure energy is calculated according to a critical dimension (CD) of an exposing layer. A first CD deviation is obtained from a layer before the exposing layer. From the first CD deviation, a first energy compensation is calculated. Whether the deviation of photoresist sensitivity of two sequential batches is less than 1% is checked. If the deviation of photoresist sensitivity of two sequential batches is less than 1%, a sum of the required exposure energy and the first energy compensation is the exposure energy applied to the exposing layer. Otherwise, a second CD deviation is commutated according to the deviation of photoresist sensitivity of two sequential batches. A second energy compensation is then obtained from the second CD deviation, and a sum of the required exposure energy and the first/second energy compensation is the exposure energy applied to the exposing layer.

10 Claims, 3 Drawing Sheets

METHOD OF FIGURING EXPOSURE ENERGY

BACKGROUND OF THE INVENTION

1. Field of the Invention

The invention relates in general to a photolithography process, and more particularly, to a method of figuring the exposure energy.

2. Description of the Related Art

For the enhancement of the integration for integrated circuit, the device dimension of the integrated circuit has to be reduced. Photolithography process is one of the most crucial semiconductor fabrication processes. The properties related to the metal-oxide-semiconductor (MOS) device structure such as the pattern of each thin film and the area doped with dopants are determined according to the photolithography process.

In the conventional critical dimension (CD) control for photolithography process, the exposure energy is compensated according to the measured results of critical dimension after performing the exposure process. Therefore, the wafers in the next batch can have a critical dimension closer to a target value.

However, the conventional method performs compensation on the exposure energy of the wafers after obtaining the CD measurement results of the exposure pattern. Therefore, the current batch of wafers has to be sacrificed. In addition, the exposure condition for a new product can only be referred from that of the same products or similar products. The exposure energy is given based on experience. The photomask CD deviation and on-line product CD baseline are not considered in this method it is often that the CD of the final exposed pattern cannot meet the target value, or even exceeds the deviation tolerance. Thus, the exposure condition of the product has to be modified. Moreover, the conventional method cannot predict how the material (such as photoresist material) used in different batch affects the CD, so that an advanced compensation cannot be made.

SUMMARY OF THE INVENTION

The invention provides a method of figuring an exposure energy that predicts the compensation in advance to reduce the deviation of CD of the final exposure pattern. The CD of the exposure pattern thus further approaches the target value.

The method of figuring an exposure energy resolves the problem of unable to figure the exposure energy for new product in the prior art.

In the method of figuring exposure energy provided by the invention, a required exposure energy is calculated according to a photomask critical dimension of a layer to be exposed (also called as "an exposing layer" hereinafter). From the thickness of a layer formed before the exposing layer, a first critical dimension (CD) deviation is obtained. A first energy compensation is obtained by calculating the first CD deviation. Whether the deviation of photoresist sensitivity between two sequential batches is less than 1% is checked. If the deviation of photoresist sensitivity between two sequential batches is less than 1%. an exposure energy applied to the exposing layer is obtained by adding the required exposure energy with the first energy compensation. Otherwise, a second CD deviation is obtained according to the deviation of photoresist sensitivity of two sequential batches, and a second energy compensation is commutated from the second CD deviation. The sum of the required exposure energy, the first energy and the third energy is the exposure energy applied to the exposing layer.

The invention compensates the energy in advance to reduce the CD deviation of the exposure pattern, so that the CD of the resultant exposure pattern is closer to the target value.

In the invention, as the exposure energy is compensated in advance, so that sacrifice of wafers for the current batch because only wafers of the next batch can be compensated in the conventional method is avoided.

Therefore, the invention accurately figures the exposure energy of a new product, so that the problem for not able to predict the exposure energy in the prior art is resolved.

Both the foregoing general description and the following detailed description are exemplary and explanatory only and are not restrictive of the invention, as claimed.

DESCRIPTION OF THE PREFERRED EMBODIMENTS

Figure 1:
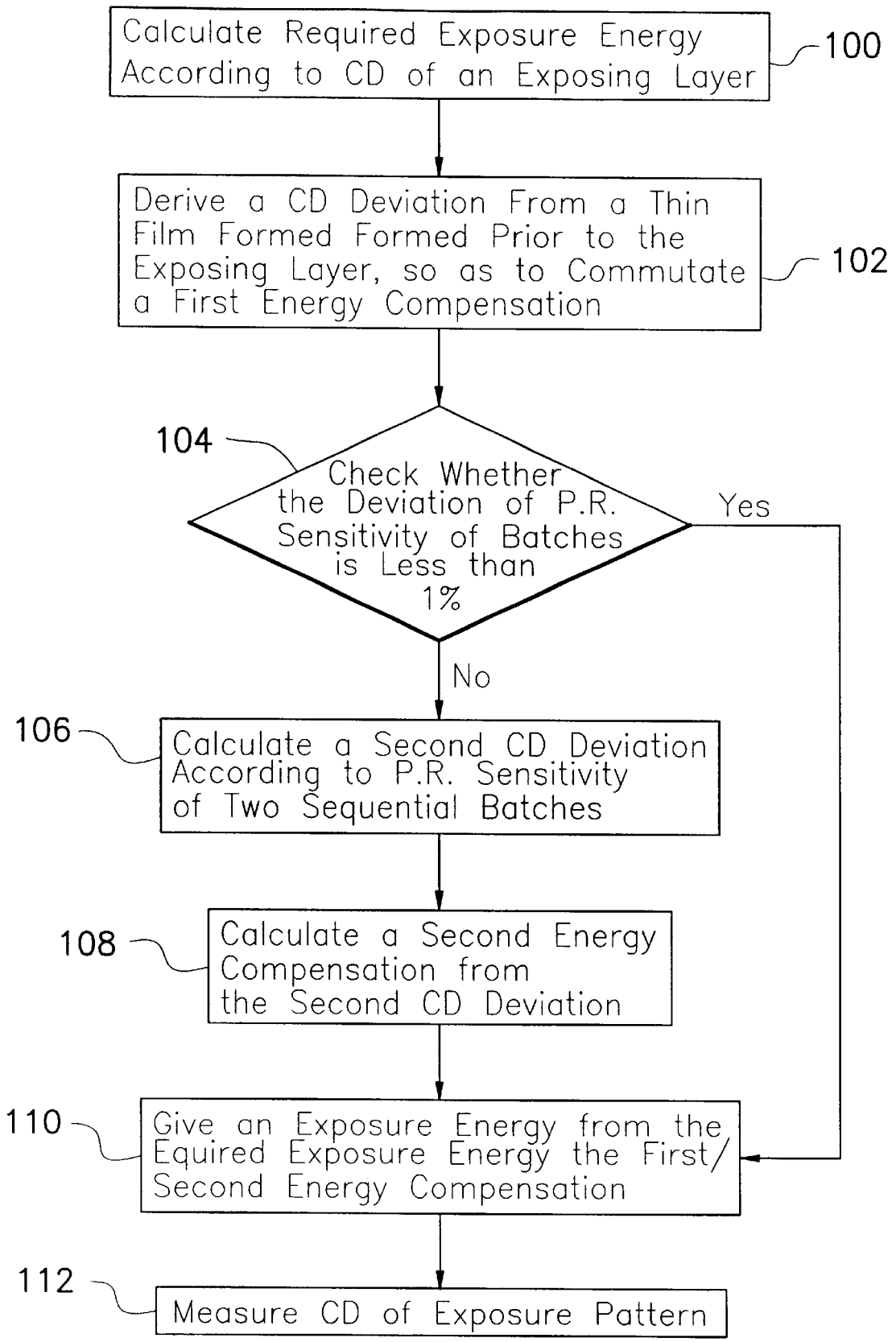
FIG. 1 is a flow chart showing an embodiment of a method to figure exposure energy according to the invention.
Figure 2:
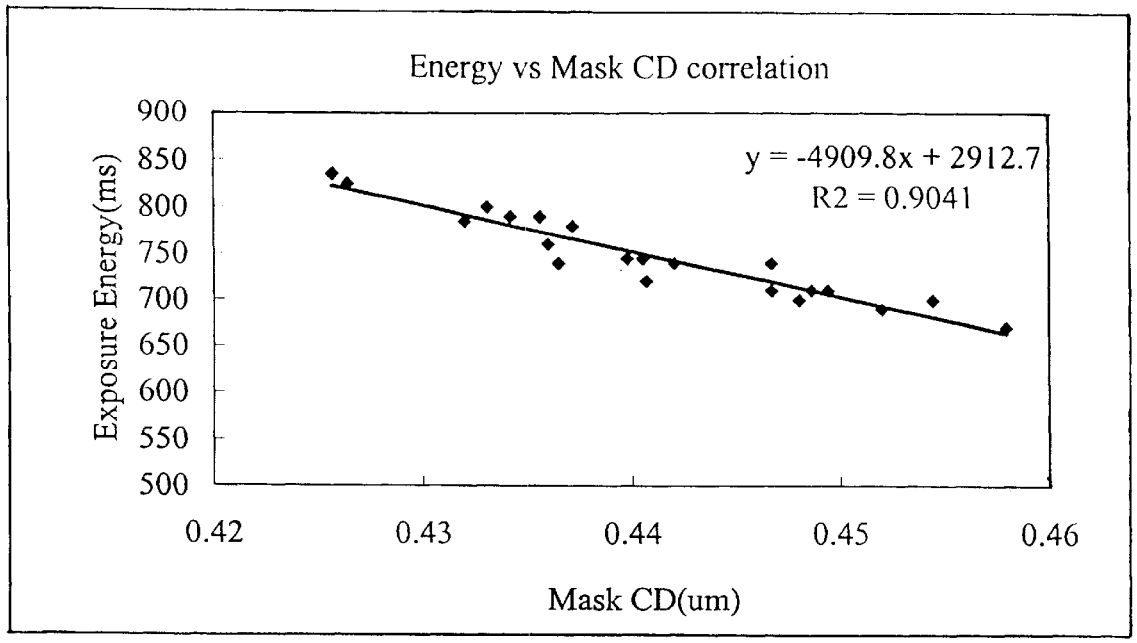
FIG. 2 shows the linear correlation between the photomask critical dimension and the exposure energy.

As shown in FIG. 1, a flow chart of an embodiment of a method to figure an exposure energy is illustrated. In FIG. 2, a linear correlation between the photomask critical dimension and the exposure energy is shown.

In FIG. 1, an embodiment of figuring the exposure energy comprises calculating a required exposure energy according to a photomask critical dimension of an exposing layer in step 100. The method to calculate the required exposure energy can be referred to FIG. 2. In FIG. 2, the history of the photomask critical dimension and the exposure energy is used to draw a linear correlation graph. The horizontal axis indicates the photomask critical dimension, while the vertical axis shows the exposure energy. Therefore, the photomask critical dimension of the exposing layer is substituted into the linear correlation formula as shown in FIG. 2 to obtain an exposure energy, which is the required exposure energy applied to the exposing layer.

Referring to FIG. 1, step 102 is performed after calculating the required exposure energy. In step 102, a critical dimension (CD) deviation is derived from the thickness of a thin film formed prior to the exposing layer. From the CD deviation, a first energy compensation can be calculated. That is, the CD deviation is derived from the thin film thickness of the layer prior to the exposing layer and a critical dimension specification target. A first energy compensation is then obtained according to the CD deviation.

Figure 3:
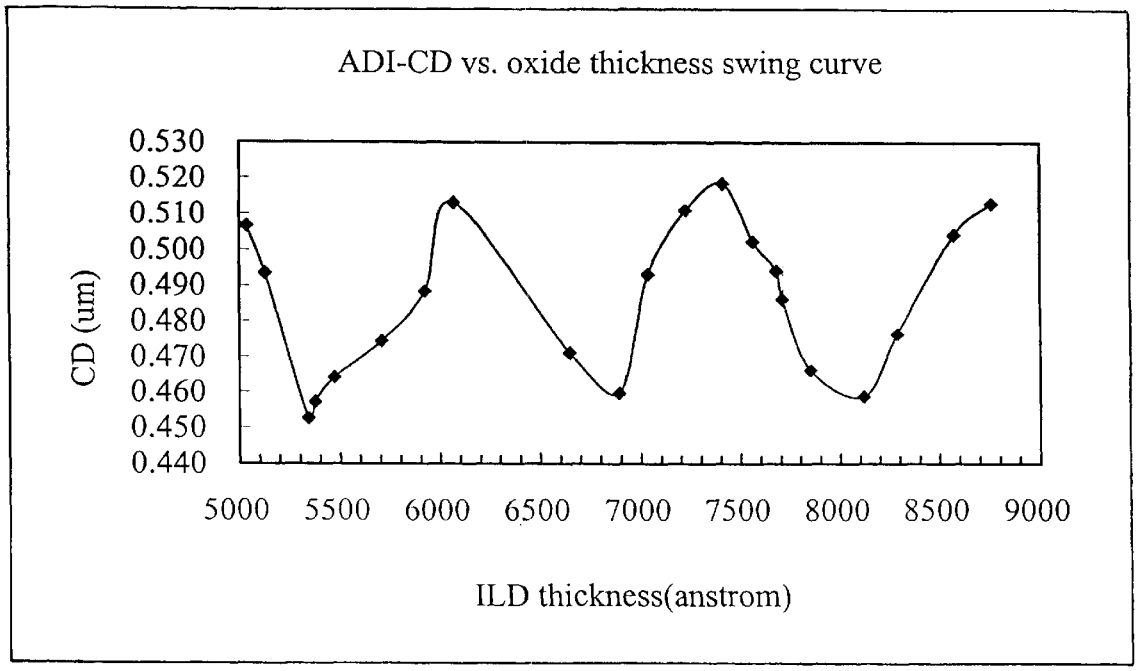
FIG. 3 shows the relation curve between the thin film thickness and the critical dimension.

FIG. 3 shows a relation curve between the thin film thickness and the critical dimension.

The method of deriving a CD deviation from the thin film thickness of a layer formed before the exposing layer is referred to FIG. 3. In FIG. 3, a curve is obtained according to the history of thin film thickness and the critical dimension. The horizontal axis indicates the thin film thickness, and the vertical axis shows the critical dimension. A critical dimension of the layer prior to the exposing layer is obtained from the thin film thickness thereof in FIG. 3. The critical dimension of the layer prior to the exposing layer can also be obtained from the thin film thickness thereof. By subtracting the critical dimension of the layer prior to the exposing layer with a midpoint value of the critical dimension specification target of the layer prior to the exposing layer, the CD deviation is then obtained. For example, when the thin film thickness of the layer prior to the exposing layer is 8000±800 angstroms, with a mid-point value of 8000 angstroms, the corresponding critical dimension according to FIG. 3 is 0.46 micron. So, the critical dimension of the layer prior to the exposing layer is 0.46 micron. An actual thickness of the layer prior to the exposing layer is 8300 angstrom, so that the corresponding critical dimension is 0.48 micron derived from FIG. 3. Accordingly, the CD deviation is found to be 0.02 micron (0.48 micron−0.46 micron=0.02 micron).

Figure 5:
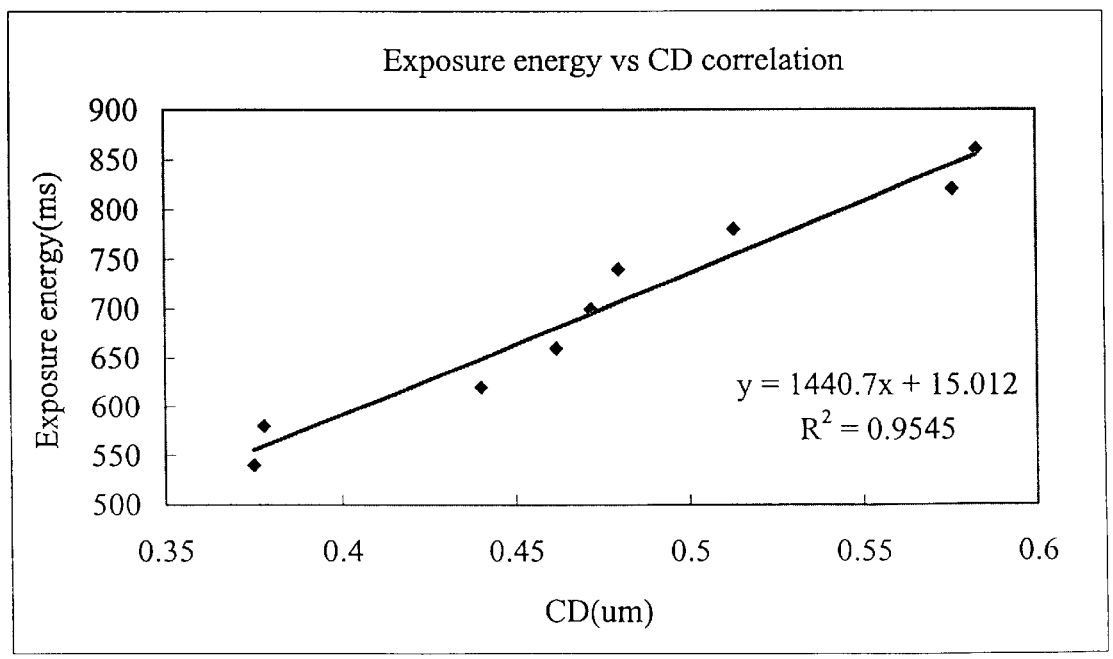
FIG. 5 shows the linear correlation between the critical dimension and the exposure energy.

FIG. 5 shows the linear correlation between the critical dimension and the exposure energy.

A first energy compensation is derived from the CD deviation obtained from FIG. 3. In FIG. 5, the linear regression formula of the critical dimension and the exposure energy is used to obtain the first energy compensation. In FIG. 5, the horizontal axis indicates the critical dimension, while the vertical axis indicates the exposure energy. By substituting the CD deviation obtained from FIG. 3 into the linear regression formula as shown in FIG. 5, a first energy compensation is obtained. For example, the CD deviation 0.02 micron obtained from FIG. 3 is substituted into the linear regression formula "Y=1440.7X+15.012" in FIG. 5, the first energy compensation is 43.826 ms.

Further referring to FIG. 1, whether the deviation of photoresist sensitivity of two sequential batches is less than 1% is checked in step 104. If the answer is yes, the step 110 is performed. An exposure energy is given by the required exposure energy in step 100 and the first energy compensation in step 102. That is, the required exposure energy obtained in step 100 is added with the first energy compensation obtained in step 102 as the required exposure energy condition required for the subsequent exposure process for the exposing layer. After performing an exposure process, the step 112 is performed. That is, the critical dimension of the exposure pattern is measured to confirm whether the CD deviation of the exposure pattern is smaller than the tolerable deviation.

If the deviation of photoresist sensitivity for two sequential batches is larger than 1% in step 104, step 106 is performed. In step 106, a second CD deviation is calculated according to the deviation of photoresist sensitivity for two sequential batches.

Figure 4:
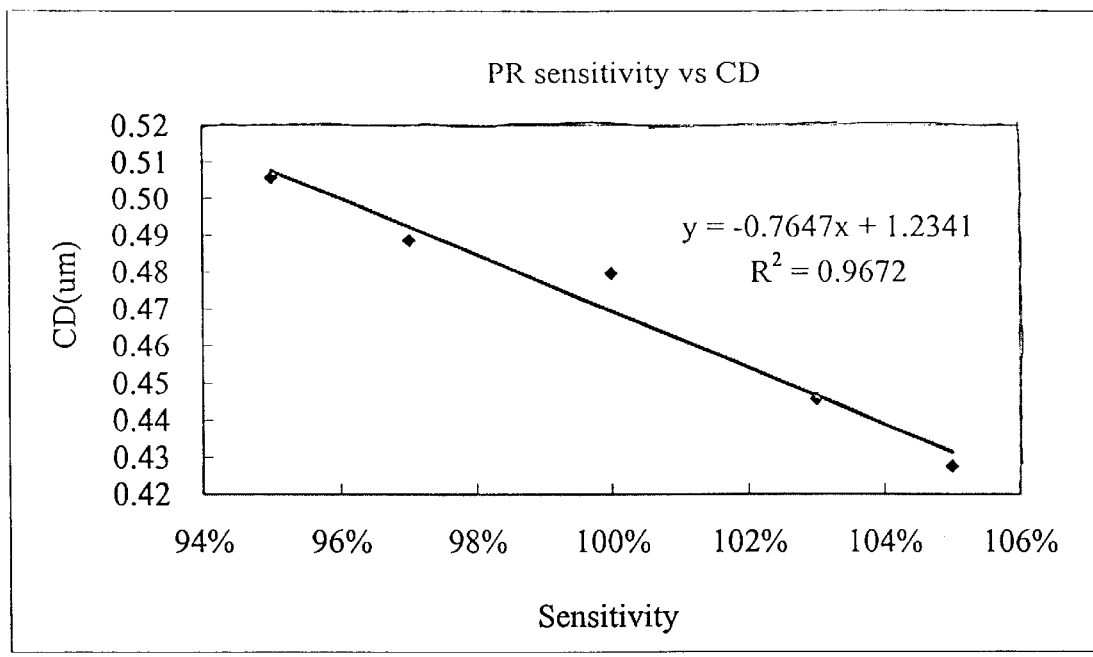
FIG. 4 shows the linear correlation between photosensitivy and the critical dimension.

FIG. 4 shows the linear correlation between the photoresist sensitivity and the critical dimension.

In the method of calculating the second CD deviation, the linear correlation between the photoresist sensitivity and the critical dimension is used to obtain the second CD deviation. In FIG. 4, the horizontal axis indicates the photoresist sensitivity, and the vertical axis indicates the critical dimension. The photoresist sensitivity of the photoresist material in the last batch is substituted into the linear correlation formula in FIG. 4, a critical dimension of the photoresist material for the last batch can be calculated. By substituting the photoresist sensitivity of photoresist material for the current batch into the formula in Figure, the critical dimension of the photoresist material for the current batch can also be calculated. The critical dimension for the current batch is subtracted with the critical dimension for the last batch to obtain a second CD deviation. For example, if the photoresist sensitivity of the photoresist material for the last batch is 97%, the critical dimension thereof is 0.492 micron. When the photoresist sensitivity of the photoresist material for the last batch is 99%, the critical dimension thereof is 0.477 micron. Thus, the second CD deviation is −0.015 micron (0.477 micron−0.492 micron=−0.015 micron).

Referring to FIG. 1, a second energy compensation is obtained from the second CD deviation in step 108. In the method of obtaining the second energy compensation, the second CD deviation is substituted into the linear correlation formula in FIG. 5. For example, the second CD deviation of −0.015 micron obtained in step 106 is substituted into the formula "Y=1440.7X+15.012" in FIG. 5 to obtain the second energy compensation −6.5985 ms.

Step 110 is then performed. In step 110, the required exposure energy obtained in step 100, the first energy compensation obtained in step 102, and the second energy compensation obtained in step 108 are calculated to give an exposure energy. That is, a sum of the required exposure energy, the first and second energy compensations is the exposure energy condition applied to performing an exposure process on the exposing layer.

After performing an exposure process, the critical dimension of the exposure pattern is measured in step 112. Whether the critical dimension deviation of the exposure pattern is within the tolerance is confirmed.

Since the measurement result of the critical dimension of the exposure pattern can be found, the exposure energy condition figured in the invention allows the critical dimension further approaches a target value, so that the CD deviation falls within the deviation tolerance. Thus, the sacrifice of wafers in previous batch in the conventional method that cannot set up exposure energy in advance is avoided. In addition, the exposure energy of the new product can be accurately figured in the invention.

According to the above, the invention comprises the following advantages:

1. The invention applies the method of compensation in advance to reduce the CD deviation of the exposure pattern, so that the CD of the exposure pattern is closer to the target value.
2. Using the method to figure exposure energy in advance, the sacrifice of wafers in the current batch in the prior art because only the wafers of next batch can be compensated is avoided.
3. The invention can figure the exposure energy of new products more accurately. Therefore, the problem of unable to predict the exposure energy in the prior art is resolved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of figuring an exposure energy, comprising:
   calculating a required exposure energy according to a photomask critical dimension of an exposing layer;
   obtaining a first critical dimension deviation from a thin film thickness of a layer formed prior to the exposing layer, and calculating a first energy compensation from the first critical dimension deviation; and obtaining an exposure energy by adding the required exposure energy with the first energy compensation when a deviation of photoresist sensitivity for two sequential batches is less than 1%.

2. The method according to claim 1, wherein the step of calculating the required exposure energy includes substituting the photomask critical dimension into a linear correlation formula of photomask critical dimension and exposure energy.

3. The method according to claim 1, wherein the step of obtaining the first energy compensation includes obtaining the first critical dimension deviation from a relation curve of thin film thickness and critical dimension.

4. The method according to claim 1, wherein the step of calculating the first energy compensation from the first critical dimension deviation includes substituting the first critical dimension deviation into a linear correlation formula of critical dimension and exposure energy.

5. A method of figuring an exposure energy, comprising:

calculating a required exposure energy according to a photomask critical dimension of an exposing layer;

obtaining a first critical dimension deviation from a thin film thickness of a layer formed prior to the exposing layer, and calculating a first energy compensation from the first critical dimension deviation;

commutating a second critical dimension deviation according to the deviation of photoresist sensitivity for two sequential batches when it is larger than 1%;

calculating a second energy compensation from the second critical dimension deviation; and adding the required exposure energy, the first energy compensation and the second energy compensation to obtain an exposure energy for the exposing layer.

6. The method according to claim 5, wherein the step of calculating the required exposure energy includes substituting the photomask critical dimension into a linear correlation formula of photomask critical dimension and exposure energy.

7. The method according to claim 5, wherein the step of obtaining the first energy compensation includes obtaining the first critical dimension deviation from a relation curve of thin film thickness and critical dimension.

8. The method according to claim 5, wherein the step of calculating the first energy compensation from the first critical dimension deviation includes substituting the first critical dimension deviation into a linear correlation formula of critical dimension and exposure energy.

9. The method according to claim 5, wherein the step of commutating the second critical dimension deviation including substituting the deviation of photoresist sensitivity for two sequential batches into a linear correlation formula of photoresist sensitivity and critical dimension.

10. The method according to claim 5, wherein the step of calculating the second energy compensation from the second critical dimension deviation includes substituting the second critical dimension deviation into a linear correlation formula of critical dimension and exposure energy.

* * * * *